United States Patent [19]

Wright et al.

[11] Patent Number: 5,627,791
[45] Date of Patent: May 6, 1997

[54] MULTIPLE BANK MEMORY WITH AUTO REFRESH TO SPECIFIED BANK

[75] Inventors: Jeffrey P. Wright; Hua Zheng, both of Boise, Id.

[73] Assignee: Micron Technology, Inc., Boise, Id.

[21] Appl. No.: 602,593

[22] Filed: Feb. 16, 1996

[51] Int. Cl.[6] ............................................. G11C 7/00
[52] U.S. Cl. .................. 365/222; 365/233; 365/230.03; 365/236
[58] Field of Search .................................. 365/222, 233, 365/230.03, 236

[56] References Cited

U.S. PATENT DOCUMENTS

| | | | |
|---|---|---|---|
| 5,208,779 | 5/1993 | Walther et al. | 365/222 |
| 5,291,443 | 3/1994 | Lim | 365/189.04 |
| 5,335,201 | 8/1994 | Walther et al. | 365/222 |
| 5,335,202 | 8/1994 | Manning et al. | 365/222 |
| 5,446,696 | 8/1995 | Ware et al. | 365/222 |
| 5,455,801 | 10/1995 | Blodgett et al. | 365/222 |
| 5,511,033 | 4/1996 | Jung | 365/222 |

*Primary Examiner*—David C. Nelms
*Assistant Examiner*—Andrew Q. Tran
*Attorney, Agent, or Firm*—Schwegman, Lundberg, Woessner & Kluth, P.A.

[57] ABSTRACT

A synchronous random access memory, such as a synchronous dynamic random access memory or a synchronous graphic random access memory, is responsive to command signals and includes multiple bank memory arrays. A command decoder/controller responds to command signals to initiate, in a first system clock cycle, an auto-refresh command controlling an auto refresh operation to a specified one of the multiple bank memory arrays.

17 Claims, 6 Drawing Sheets

MULTIPLE BANK MEMORY WITH AUTO REFRESH TO SPECIFIED BANK

THE FIELD OF THE INVENTION

The present invention relates; to semiconductor memory integrated circuits and, more particularly to synchronous random access memories such as synchronous dynamic random access memories and synchronous graphic random access memories.

BACKGROUND OF THE INVENTION

Synchronous random access memories such as synchronous dynamic random access memories (SDRAMs) and a synchronous graphic random access memories (SGRAMs) are designed to operate in a synchronous memory system. Thus, all input and output signals, with the exception of a clock enable signal during power down and self refresh modes, are synchronized to an active edge of a system clock.

SDRAMs offer substantial advances in dynamic memory operating performance. For example, some SDRAMs are capable of synchronously providing burst data in a burst mode at a high-speed data rate by automatically generating a column address to address a memory array of storage cells organized in rows and columns for storing data within the SDRAM. In addition, if the SDRAM includes two or more banks of memory arrays, the SDRAM preferably permits interleaving between the two or more banks to hide precharging time. SGRAMs differ from SDRAMs by providing certain column block write functions and masked write or write-per-bit functions to accommodate high-performance graphics applications In an asynchronous DRAM, once row and column addresses are issued to the DRAM and a row address strobe signal and column address strobe signal are deactivated, the DRAM's memory is precharged and available for another access. Another row cannot be accessed in the DRAM array, however, until the previous row access is completed.

By contrast, a SDRAM requires separate commands for accessing and precharging a row of storage cells in the SDRAM memory array. Once row and column addresses are provided to a SDRAM in a SDRAM having multiple bank memory array's, a bank memory array which is accessed remains active. An internally generated row address strobe remains active and the selected row is open until a PRECHARGE command deactivates and precharges the selected row of the memory array.

In a SDRAM, a transfer operation involves performing a PRECHARGE command operation to deactivate and precharge a previously accessed bank memory array, performing an ACTIVE command operation to register the row address and activate the bank memory array to be accessed in the transfer operation, and performing the transfer READ or WRITE command to register the column address and initiate a burst cycle.

In current SDRAMs and SGRAMs, an AUTO REFRESH command is needed each time a refresh is required. During an auto refresh operation in current SDRAMs and SGRAMs, all bank memory arrays in multibank memory devices are idle. Furthermore, the user of the SDRAM or SGRAM device does not know which bank is being refreshed. Prior art SDRAM or SGRAMs typically perform auto refresh operations by toggling between the two banks during each count of the row address. For example, the auto refresh operation is performed by refreshing row 0 of bank 0, then prior to incrementing the row address, the banks are switched to refresh row 0 of bank 1. The row address that is internally generated during the auto refresh operation is then incremented to row 1 and the banks are switched so that row 1 of bank 0 is refreshed, then the banks are switched to refresh row 1 of bank 1. This alternating between banks is continued until all rows in all banks of the memory device are refreshed. There is a need for an improved auto refresh operation in SDRAMs and SGRAMs.

SUMMARY OF THE INVENTION

The present invention provides a memory device responsive to command signals and operating in synchronization with active edges of a system clock. The memory device includes multiple bank memory arrays. Each bank memory array includes storage cells. A command decoder/controller responds to selected command signals to initiate, at a first active edge of the system clock, an auto refresh command controlling an auto refresh operation to a specified one of the multiple bank memory arrays.

In one embodiment of the present invention, the memory device is also responsive to a bank address signal. In this embodiment, the memory device further comprises a refresh controller circuit specifying the specified one of the multiple bank memory arrays based on the, bank address signal received at the first active edge of the system clock. In another embodiment of the present invention, the specified one of the multiple bank memory arrays is predetermined prior to performing the auto refresh command initiated at the first active edge of the system clock. The one of the multiple, bank memory arrays is predetermined in one embodiment of the present invention based on which bank memory array is initially refreshed and a subsequent known order of refreshing the bank memory arrays.

The command decoder/controller is preferably responsive to selected command signals to initiate during the auto refresh operation to the specified bank memory array a second command controlling a second operation, which is not an auto refresh operation, to a second bank :memory array of the multiple bank memory arrays, which is not the specified bank memory array.

One embodiment of the memory device of the present invention includes a refresh counter having a separate counter portion for each of the multiple bank memory arrays for incrementing an address of a row to be refreshed.

In one preferred embodiment of the present invention, the memory device is a synchronous dynamic random access memory (SDRAM). In another preferred embodiment of the present invention, the memory device is a synchronous graphic random access memory (SGRAM).

Because the bank memory array in which the auto refresh operation is performed is specified, the user of the memory device according to the present invention can perform commands to the bank memory array which is not being refreshed during the auto refresh operation. For example, a transfer operation such as a read from or a write to one bank memory array can be performed when another bank memory array is being auto refreshed.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
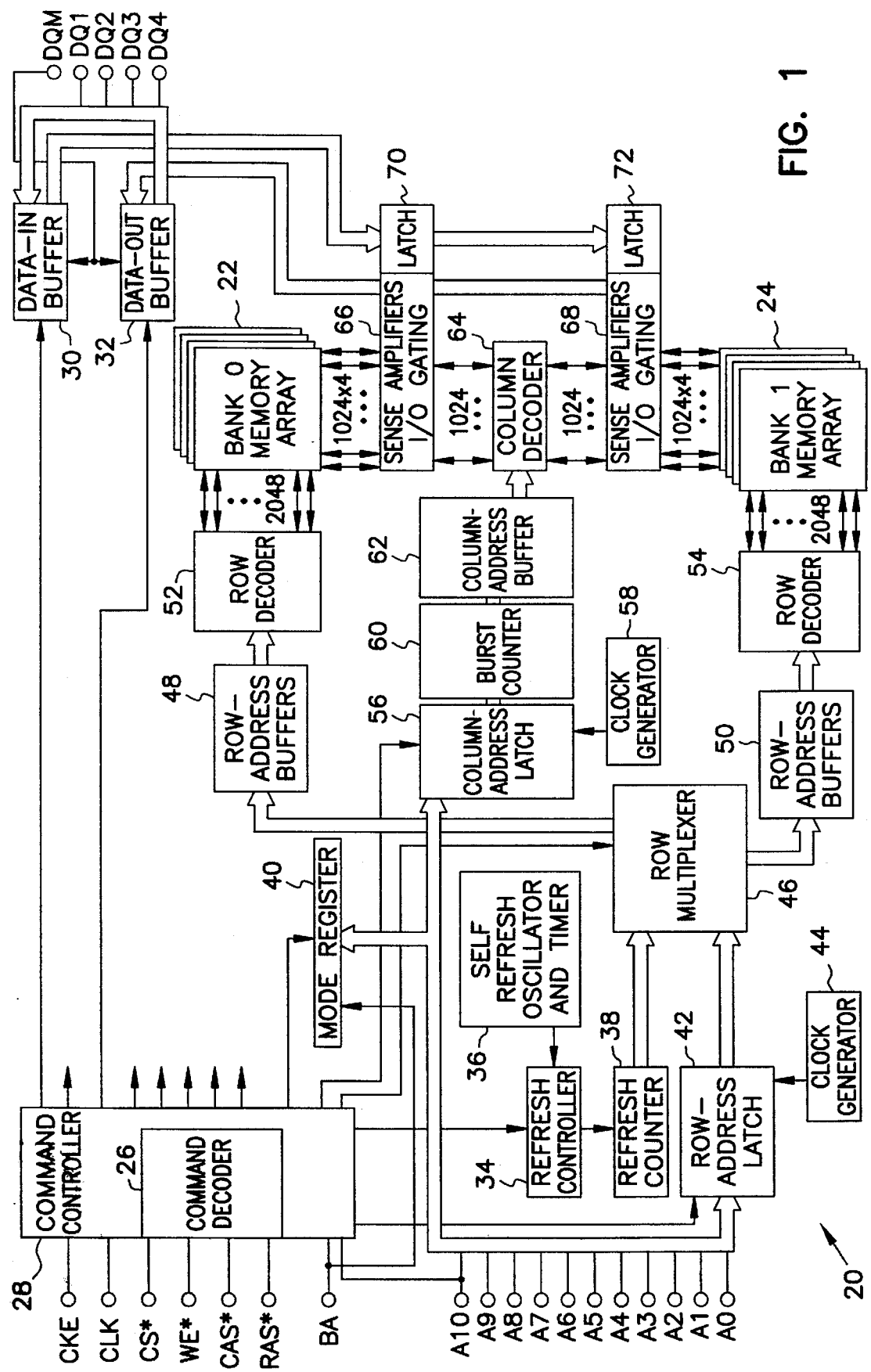
FIG. 1 is a block diagram of a SDRAM according to the present invention.

A synchronous dynamic random access memory (SDRAM) according to the present invention is illustrated generally at 20 in FIG. 1 in block diagram form. Much of the circuitry of SDRAM 20 is similar to circuitry in known SDRAMs, such as the Micron Technology, Inc. MT48LC4M4R1 S 4 MEG X 4 SDRAM, which is described in detail in the corresponding Micron Technology, Inc. Functional Specification, which is incorporated herein by reference.

The present invention is not limited to SDRAMs, as the present invention is equally applied to other synchronous random access memories devices such as a synchronous graphics random access memory (SGRAM). The operation of a SGRAM according to the present invention is similar to the operation of a SDRAM. Thus, a SGRAM is not illustrated in the drawings. SGRAMs differ from SDRAMs by providing certain column block write functions and masked write or write-per-bit functions to accommodate high-performance graphics applications Much of the circuitry of a SGRAM according to the present invention is similar to circuitry in known SGRAMs, such as the Micron Technology, Inc. MT41LC256K32D4(S) 256K X 32 SGRAM, which is described in detail in the corresponding Micron Technology, Inc. 1995 DRAM Data Book, and which is incorporated herein by reference.

As illustrated in FIG. 1, SDRAM 20 includes a bank 0 memory array 22 and a bank 1 memory array 24 which both comprise storage cells organized in rows and columns for storing data. In one embodiment of SDRAM 20, each bank memory array comprises four separate arrays of 2048 rows× 1024 columns.

Power is supplied to SDRAM 20 pins Vcc and Vss. A typical SDRAM 20 provides optimum memory performance in a low voltage environment such as a 3.3 V environment. A system clock (CLK) signal is provided through a CLK input pin and a clock enable signal (CKE) is provided through a CKE input pin to SDRAM 20. The CLK signal is activated and deactivated based on the state of the CKE signal. All the input and output signals of SDRAM 20, with the exception of the CKE input signal during power down and self refresh modes, are synchronized to the active going edge (the positive going edge in the embodiment illustrated in FIG. 1) of the CLK signal.

A chip select (CS*) input pin inputs a CS* signal which enables, when low, and disables, when high a command decode 26. Command decode 26 is included in a command controller 28. Command decoder 26 receives control signals including a row address strobe (RAS*) signal on a RAS* pin, column address strobe (CAS*) signal on a CAS* pin, and a write enable (WE*) signal on a WE* pin. Command decoder 26 decodes the RAS*, CAS*, and WE* signals to place command controller 28 in a particular command operation sequence. Command controller 28 controls the various circuitry of SDRAM 20 based on decoded commands such as during controlled reads or writes from or to bank 0 memory array 22 and bank 1 memory array 24. A bank address (BA) signal is provided on a BA input pin to define which bank memory array should be operated on by certain commands issued by command controller 28.

Address inputs bits are provided on input pins A0–A10. As described below, both the row and column address input bits are provided on the address input pins. During write transfer operations, data is supplied to SDRAM 20 via input/output pins (DQ1–DQ4). During read transfer operations, data is clocked out of SDRAM 20 via input/output pins DQ1–DQ4. An input/output mask signal is provided on a DQM input pin to provide non-persistent buffer control for a data-in buffer 30 and a data-out buffer 32.

SDRAM 20 must be powered-up and initialized in a predefined manner. In addition, both bank 0 and bank 1 memory arrays 22 and 24 must be precharged and placed in an idle state. The precharging of the bank memory arrays is preformed with a precharge command operation which is described in more detail below. Once in the idle state, two AUTO-REFRESH operations must be performed. Once the two AUTO-REFRESH operations are performed, SDRAM 20 is available for programming of a mode register 40. Mode register 40 is assumed to have an unknown state when SDRAM 20 is powered up. Consequently, before performing any operational command, mode register 40 must be set or programmed.

Mode register 40 is typically a persistent register wherein once programmed, the mode register retains the program op-code until the mode register is reprogrammed or SDRAM 20 loses power. Most of the possible programmable options of SDRAM 20 are defined in the op-codes stored in mode register 40. Typically mode register 40 is programmed by providing a desired op-code via the BA input pins and the A0–A10 address inputs, in conjunction with a SET MODE REGISTER command determined by CS*, RAS*, CAS*, and WE* being registered low.

A no operation (NOP) command can be provided to SDRAM 20 to prevent other unwanted commands from being registered during idle or wait states.

Two refresh commands are typically available in SDRAM 20 which are an AUTO-REFRESH command and a SELF-REFRESH command. The AUTO-REFRESH command is performed with refresh controller 34 and refresh counter 38 in a manner described in detail below to refresh the memory arrays. The SELF-REFRESH command is performed with refresh controller 34, self-refresh oscillator and timer 36, and refresh counter 38 in a manner described below. Self-refresh oscillator and timer 96 internally generates a clock signal to provide internal timing for when auto refreshes commands occur in self-refresh mode.

An AUTO REFRESH command is initiated by registering CS*, RAS* and CAS* low with WE* high. The AUTO REFRESH command is preferably employed while operating SDRAM 20. The AUTO REFRESH command is non-persistent, and therefore must be issued each time a refresh is required.

Addressing of the rows is generated by internal refresh controller 34 and refresh counter 38. Thus, the A0–A10 address inputs are treated as "don't care" conditions during an AUTO REFRESH command. In one embodiment of the SDRAM 20 having 4096 rows, all 4,096 rows need to be refreshed every 64 ms. Therefore, providing a distributed AUTO REFRESH command every 15.625 microseconds meets this refresh requirement and ensures that each row is refreshed. A non-preferred alternative form of refreshing is accomplished by issuing all 4,096 AUTO REFRESH commands in a burst at a minimum cycle rate every 64 ms.

A. SELF-REFRESH command is initiated by registering CKE, CS*, RAS*, and CAS* low with WE* high. Note that the command input signals are identical to an AUTO REFRESH command except that CKE is disabled. Once the SELF-REFRESH command is registered, all the inputs to SDRAM 20 become "don't cares" with the exception of CKE, as CKE must remain low.

Once SELF-REFRESH mode is engaged with the SELF-REFRESH command, SDRAM 20 provides its own internal clocking to cause it to perform its own AUTO REFRESH operations. The internal clocking is performed by self refresh oscillator and timer 36. In this way SDRAM 20 can remain in SELF-REFRESH mode for an indefinite period. Like during the AUTO REFRESH mode, the addressing during SELF-REFRESH mode is performed with refresh controller 34 and refresh counter 38.

To exit SELF-REFRESH mode, the system clock must be stable prior to CKE going high. Once CKE transitions to high, SDRAM 20 must have NOP commands issued for an amount of time required for completion of any bank memory array being internally refreshed.

Figure 2:
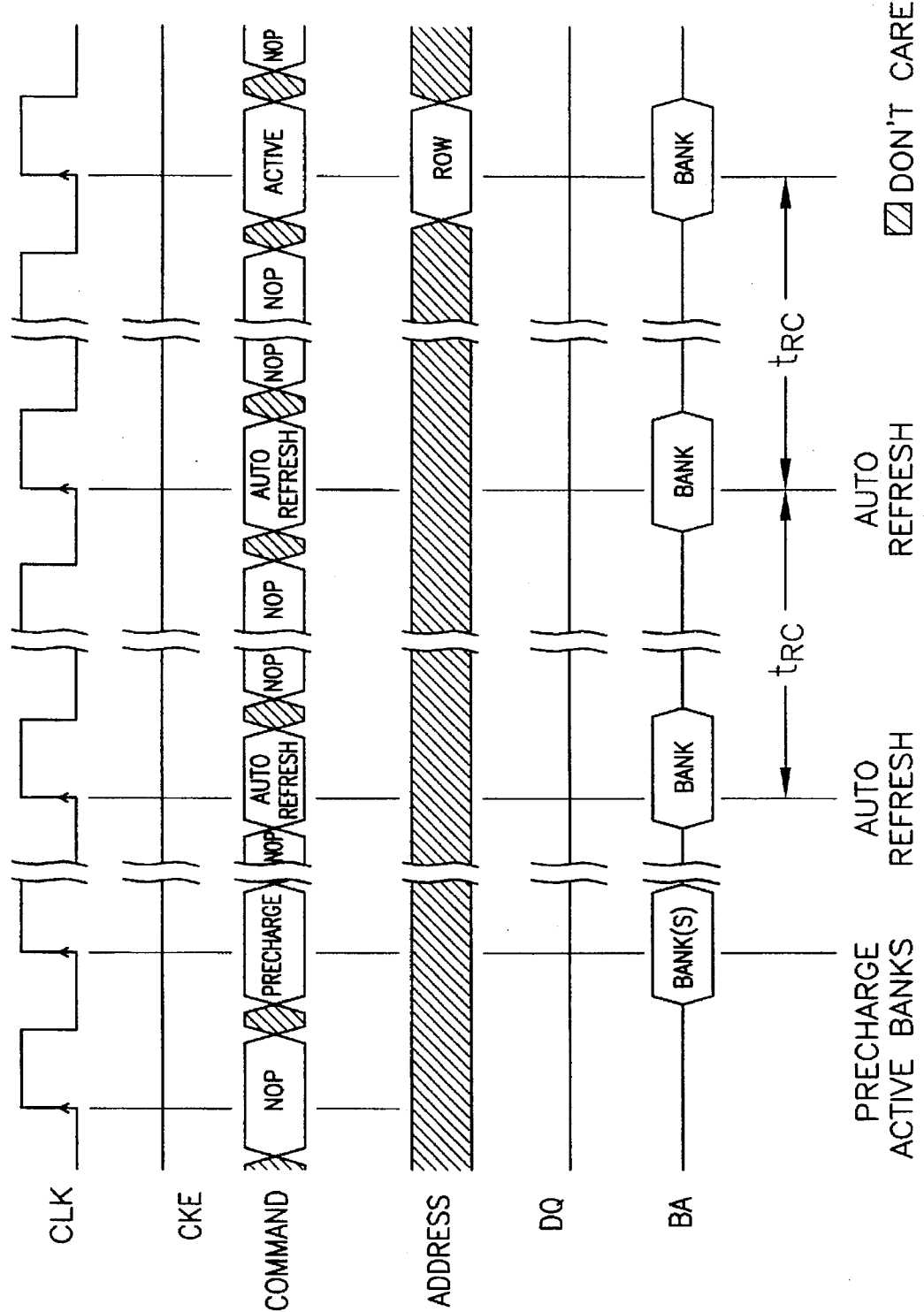
FIG. 2 is a timing diagram illustrating an auto refresh operation performed in a bank specified by an incoming bank address signal in the SDRAM of FIG. 1 during auto refresh mode.

An auto refresh operation in one embodiment of SDRAM 20 performed in a bank memory array specified by the BA signal during auto refresh mode is illustrated in timing diagram form in FIG. 2. As indicated in FIG. 2, unlike previous SDRAMs or SGRAMs, where the BA signal is a don't care during the initiation of the auto refresh operation, each auto refresh operation in this embodiment of SDRAM 20 is to a bank memory array specified by the state of the BA signal provided on the BA pin.

Preferably, the AUTO REFRESH commands are not alternated between banks, instead more than one row in the specified bank is auto refreshed before switching banks. For example, in one embodiment, refresh counter 38 provides row 0 of the specified bank, then row 1 of the specified bank, then row 2 of the specified bank, . . . , and finally row 2,048 of the specified bank of SDRAM 20. In this embodiment, once one bank memory array is auto refreshed, the other bank memory array can be auto refreshed. In another preferred embodiment, refresh counter 38 counts partially or entirely through the rows of the specified bank than switches to another bank. In this embodiment, refresh counter 38 preferably counts through any number of rows from 1 to 2048 prior to switching banks.

Figure 3:
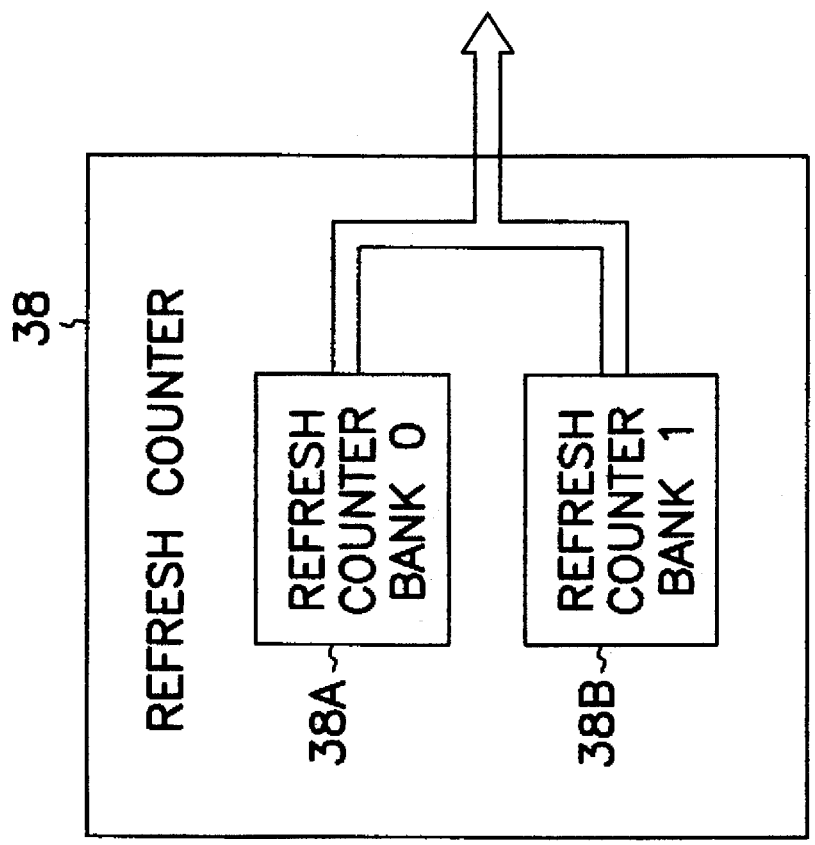
FIG. 3 is a block diagram of a refresh counter employed in one embodiment of the SDRAM of FIG. 1.

A refresh counter 38 employed in one preferred embodiment of SDRAM 20 is illustrated in block diagram form in FIG. 3. This preferred embodiment of SDRAM 20 includes a separate refresh counter portion for each bank memory array in the SDRAM. For example, as illustrated in FIG. 3, refresh counter 38 includes a refresh counter bank 0 portion 38A and a refresh counter bank 1 portion 38B. If each bank memory array has 2048 row, each refresh counter bank portion includes 11 bits to hold the existing row address currently being refreshed. This is in contrast to a single portion counter 38 which has one counter portion with 11 bits to address the 2048 rows of every bank memory array. By having a refresh counter portion dedicated to each bank, the auto refresh operation can stop partially through the refreshing of rows in a given specified bank. For example, an auto refresh operation can be performed for row 0 through row 8 in bank 0, then switch to bank 1 to perform auto refreshes on addressed rows. When the auto refresh operation returns to bank 0, the count held in refresh counter bank 0 portion 38A indicates that the refreshing was last performed on row 8 of bank 0, so that refreshing then begins in row 9 or whatever row was due to be refreshed prior to switching banks.

Figure 4:
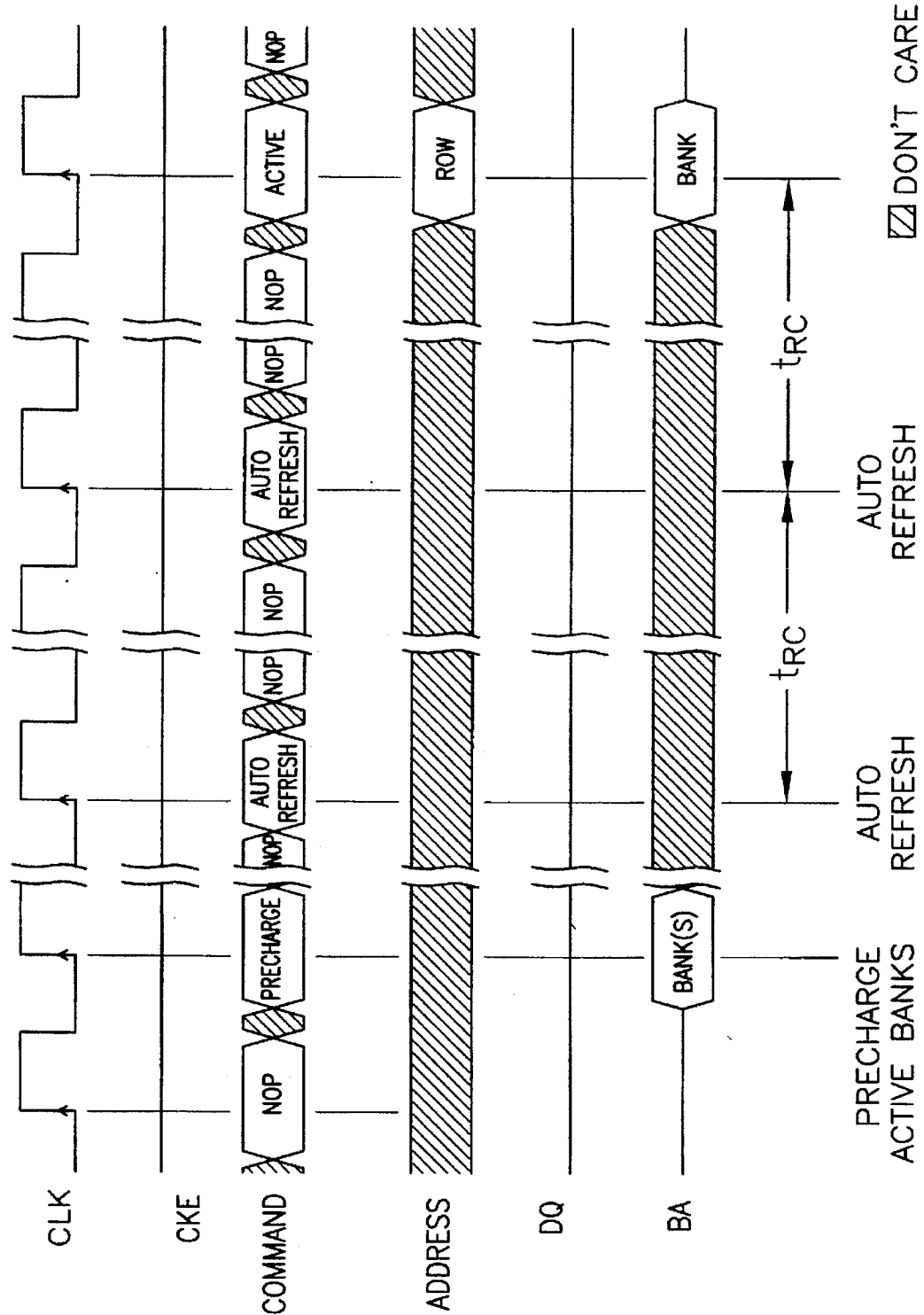
FIG. 4 is a timing diagram illustrating art auto refresh operation performed in a predetermined specified bank in the SDRAM of FIG. 1 during auto refresh mode.

An auto refresh operation performed in a predetermined specified bank memory array of an alternative embodiment of SDRAM 20 during auto refresh mode is illustrated in timing diagram form in FIG. 4. In this embodiment of the SDRAM or SGRAM according to the present invention, the BA signal is a don't care during the initiation of the auto refresh operation. Nevertheless, prior to issuing the AUTO REFRESH command, one of the banks is predetermined as the bank to be auto refreshed. Preferably, the AUTO REFRESH commands are not alternated between banks, rather all 2048 rows of the specified predetermined bank memory array are refreshed in the predetermined bank before switching banks. In this way, other command can be performed in the bank memory array not being refreshed.

Figure 5:
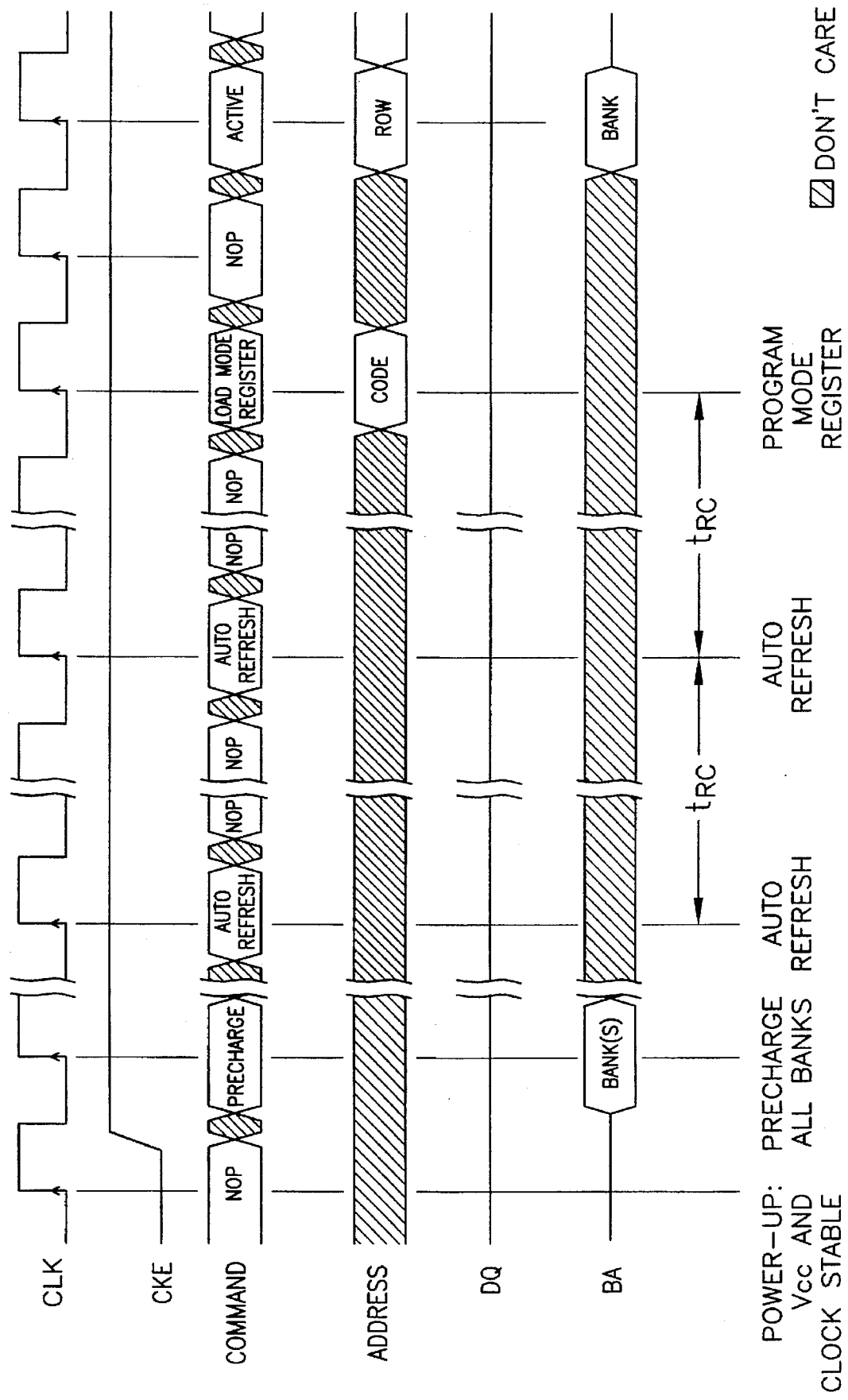
FIG. 5 is a timing diagram illustrating art auto refresh operation starting at a predetermined specified bank in the SDRAM of FIG. 1 during initialization and loading of a mode register.

For this embodiment, since the BA signal is not used to specify the bank, the user of the memory device must keep track of which bank the AUTO REFRESH command is being performed in. In FIG. 5, a timing diagram illustrates an auto refresh operation starting at a predetermined specified bank in SDRAM 20 during initialization and loading of mode register 40. As described above for the two bank SDRAM 20, after both bank memory arrays have been precharged and placed in an idle state, two auto refresh operations are performed prior to the programming of mode register 40. As indicated in FIG. 5, the initial AUTO REFRESH command is started in the bank 0 memory array. Since, the AUTO REFRESH commands complete the refreshing of all 2048 rows prior to switching banks, the user can keep track of which bank an auto refresh operation is being performed in based on the knowledge of where the initial auto refresh is performed in SDRAM 20 and thereafter, the order of refreshing the banks. In a two bank system, the knowledge of the current bank can be maintained simply by toggling a bit each time the bank is switched.

In an alternative embodiment, the user of the memory device does not need to start tracking which bank the AUTO REFRESH command is being performed in during initialization, instead the user of the memory device issues a special AUTO REFRESH command or some other special command to indicate that the next auto refresh operation is to be performed in a preset bank, such as bank 0, or in a user determined bank. After issuing the special command, the user then must track which bank the current auto refresh operation is being performed in as described above.

All the embodiments of the SDRAM or SGRAM according to the present invention permit the user of the memory device to know which bank memory array in a multi-bank system is being refreshed. In one embodiment, the user specifies the bank to be refreshed at the initiation of an AUTO REFRESH command with the BA signal on the BA pin in a two bank memory device or on multiple BA pins in a memory device with more than two banks. In another embodiment, the first refresh is to a known bank and the order of the banks to be subsequently refreshed is known. In either case, with the present invention, only one bank (the bank specified to be refreshed) needs to be idle at a given time. Thus, other commands can be performed on other banks not being refreshed during an auto refresh operation on a specified bank.

Figure 6:
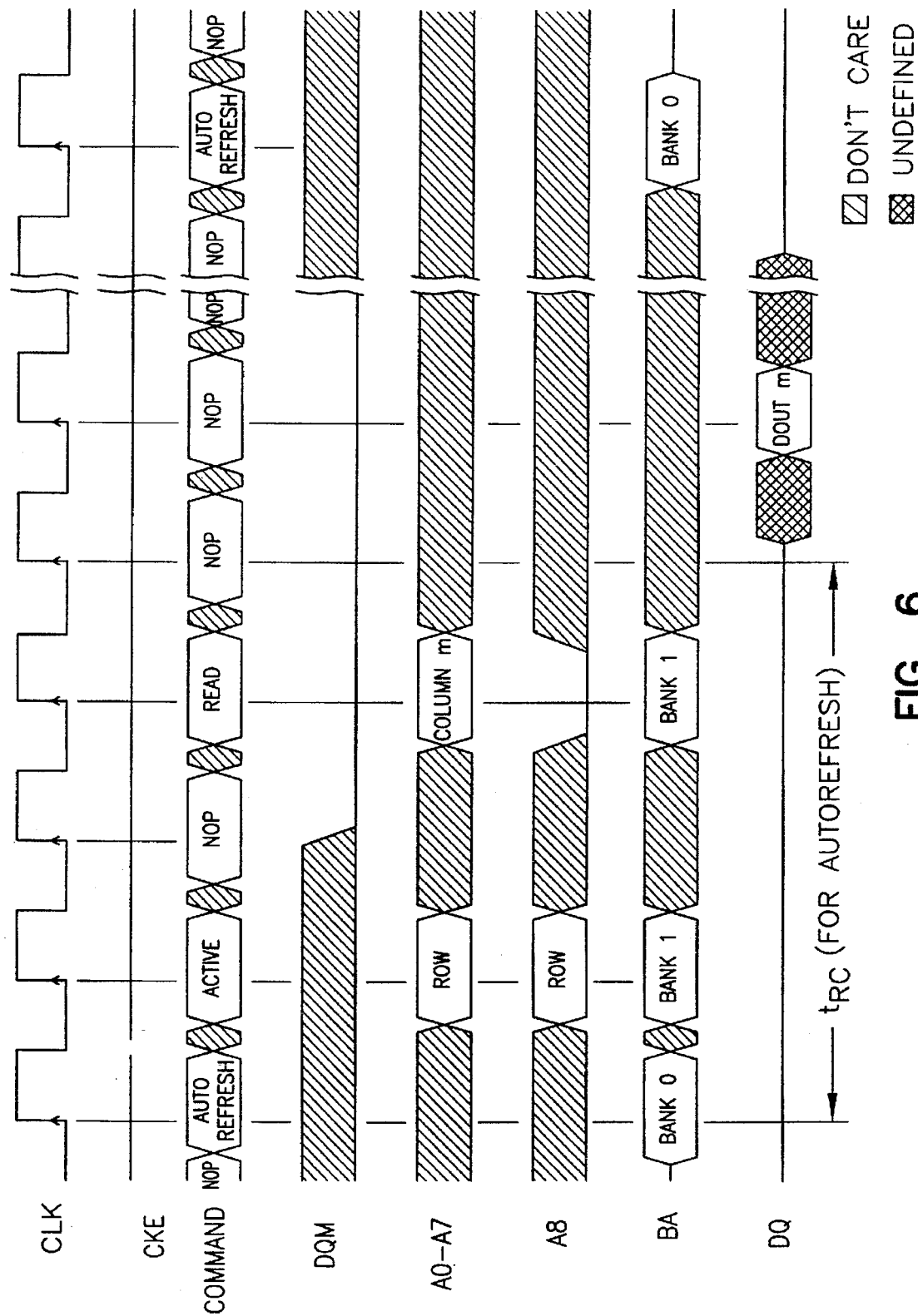
FIG. 6 is a timing diagram illustrating an auto refresh operation performed in a bank 0 as specified by an incoming bank address signal and an active operation followed by a read operation in a bank 1 of the SDRAM of FIG. 1.

The $t_{RC}$ time, shown in FIGS. 2, 4, and 5, representing the command period from a refresh to a refresh or from a refresh to an ACTIVE command can be utilized to perform commands in banks not being refreshed. For example, the auto refreshing of the bank 0 memory array while an active and a read operation are performed in the bank 1 memory array is illustrated in timing diagram form in FIG. 6. As illustrated in FIG. 6, an auto refresh command is started by specifying bank 0 as the specified bank memory array to be refreshed. Subsequently, an ACTIVE command is started in bank 1 to activate the rows of the bank 1 memory array. A read command with a read latency of two is then performed to read data out from column m of the activated row. This transfer operation is performed between two AUTO REFRESH commands to bank 0. Although the ACTIVE command is shown after the AUTO REFRESH command, the ACTIVE command to bank 1 could be performed before the first AUTO REFRESH command illustrated in. FIG. 6.

FIG. 6 shows an ACTIVE command and a READ command, but it will be understood by those skilled in the art of memory devices, that a write operation which writes data into SDRAM 20 or other operation could also be performed between the two AUTO REFRESH commands during the $t_{RC}$ time. In addition, the read operation is shown for one column of data, but could easily be extended to apply to a burst of length two, four, eight, or full page if the operation could be performed in between the two AUTO REFRESH commands in the time represented by $t_{RC}$. Furthermore, the embodiments of SDRAM 20 described above refer to a two bank memory device, but the present invention applies to any multi-bank synchronous memory device such as a four or eight bank memory device.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A memory device responsive to command signals and operating in synchronization with active edges of a system clock, the memory device comprising:

multiple bank memory arrays, each bank memory array having storage cells; and a command decoder/controller responsive to selected command signals to initiate, at a first active edge of the system clock, an auto-refresh command controlling an auto refresh operation to a specified one of the multiple bank memory arrays.

2. The memory device of claim 1 wherein the memory device is also responsive to a bank address signal, and wherein the memory device further comprises a refresh controller circuit specifying the specified one of the multiple bank memory arrays based on the bank address signal received at the first active edge of the system clock.

3. The memory device of claim 1 wherein the specified one of the multiple bank memory arrays is predetermined prior to performing the auto refresh command initiated at the first active edge of the system clock.

4. The memory device of claim 3 wherein the one of the multiple bank memory arrays is predetermined based on which bank memory array is initially refreshed and a subsequent known order of refreshing the bank memory arrays.

5. The memory device of claim 3 wherein the one of the multiple bank memory arrays is predetermined based on a command specifying which bank is to be next refreshed and a subsequent known order of refreshing the bank memory arrays.

6. The memory device of claim 1 wherein the command decoder/controller is responsive to selected command signals to initiate during the auto refresh operation to the specified bank memory array a second command controlling a second operation, which is not an auto refresh operation, to a second bank memory array of the multiple bank memory arrays, which is not the specified bank memory array.

7. The memory device of claim 2 further comprising a refresh counter for incrementing an address of a row to be refreshed, wherein the refresh counter has a separate counter portion for each of the multiple bank memory arrays.

8. The memory device of claim 1 wherein the memory device is a synchronous dynamic random access memory.

9. The memory device of claim 1 wherein the memory device is a synchronous graphic random access memory.

10. A method of operating a memory device having multiple bank memory arrays and being responsive to command signals and operating in synchronization with active edges of a system clock, the method comprising the steps of:

specifying one of the multiple bank memory arrays to be refreshed; and initiating in response to selected command signals, at a first active edge of the system clock, an auto-refresh command controlling an auto refresh operation to the specified one of the multiple bank memory arrays.

11. The method of claim 10 wherein the specified one of the multiple bank memory arrays is specified in the specifying step based on a bank address signal received at the first active edge of the system clock.

12. The method of claim 10 wherein the specifying step is performed prior to the first active edge of the system clock.

13. The method of claim 10 wherein the specified one of the multiple bank memory arrays is specified in the specifying step based on which bank memory array is initially refreshed and a subsequent known order of refreshing the bank memory arrays.

14. The method of claim 10 wherein the specified one of the multiple bank memory arrays is specified in the specifying step based on a command specifying which bank is to be next refreshed and a subsequent known order of refreshing the bank memory arrays.

15. The method of claim 10 further comprising the step of:

initiating, during the auto refresh operation to the specified bank memory array, a second command controlling a second operation, which is not an auto refresh operation, to a second bank memory array of the multiple bank memory arrays, which is not the specified bank memory array.

16. The method of claim 10 wherein the method is performed in a synchronous dynamic random access memory device.

17. The method of claim 10 wherein the method is performed in a synchronous graphic random access memory device.

* * * * *